(12) United States Patent
Fujibayashi et al.

(10) Patent No.: US 11,879,171 B2
(45) Date of Patent: Jan. 23, 2024

(54) SEMICONDUCTOR MANUFACTURING DEVICE

(71) Applicant: DENSO CORPORATION, Kariya (JP)

(72) Inventors: Hiroaki Fujibayashi, Kariya (JP); Yuichi Takeuchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 216 days.

(21) Appl. No.: 17/364,604

(22) Filed: Jun. 30, 2021

(65) Prior Publication Data

US 2021/0324517 A1     Oct. 21, 2021

Related U.S. Application Data

(63) Continuation of application No. PCT/JP2019/049632, filed on Dec. 18, 2019.

(30) Foreign Application Priority Data

Jan. 16, 2019    (JP) ................................ 2019-005486

(51) Int. Cl.
     *C23C 16/455*      (2006.01)
     *C23C 16/32*      (2006.01)

(52) U.S. Cl.
     CPC ...... *C23C 16/45557* (2013.01); *C23C 16/325* (2013.01)

(58) Field of Classification Search
     CPC ................... C23C 16/45561; C23C 16/45557
     See application file for complete search history.

(56) References Cited

U.S. PATENT DOCUMENTS

| | | |
|---|---|---|
| 5,496,408 A | 3/1996 | Motoda et al. |
| 5,589,110 A | 12/1996 | Motoda et al. |
| 2002/0179148 A1 | 12/2002 | Lull et al. |
| 2004/0200529 A1 | 10/2004 | Lull et al. |
| 2005/0241698 A1 | 11/2005 | Lull et al. |
| 2006/0272703 A1 | 12/2006 | Lull et al. |
| 2007/0071896 A1 | 3/2007 | Murphy et al. |
| 2007/0107783 A1 | 5/2007 | Lull et al. |
| 2007/0134419 A1 | 6/2007 | Mitrovic et al. |
| 2012/0328780 A1* | 12/2012 | Yamagishi ........... G05D 7/0641 118/695 |

(Continued)

FOREIGN PATENT DOCUMENTS

| | | |
|---|---|---|
| JP | 2012-009500 A | 1/2012 |
| JP | 2012-009752 A | 1/2012 |

*Primary Examiner* — Joseph A Miller, Jr.
(74) *Attorney, Agent, or Firm* — POSZ LAW GROUP, PLC

(57) ABSTRACT

A semiconductor manufacturing device includes: a thin film formation portion that includes a chamber; and a supply gas unit that introduces a supply gas into the chamber. The supply gas unit includes: multiple supply pipes; a raw material flow rate controller that is installed on each of the multiple supply pipes, and controls a flow rate; a collective pipe that is connected to the multiple supply pipes, and generates a mixed gas; multiple distribution pipes connected to a downstream side of the collective pipe; a pressure controller that is installed on one distribution pipe, and adjusts a mixed gas pressure; and a distribution flow rate controller that is installed on a distribution pipe different from the distribution pipe provided with the pressure controller, and controls a flow rate of the mixed gas.

7 Claims, 5 Drawing Sheets

(56) References Cited

U.S. PATENT DOCUMENTS

| | | |
|---|---|---|
| 2014/0224178 A1 | 8/2014 | Murphy et al. |
| 2015/0225875 A1 | 8/2015 | Mitrovic et al. |
| 2016/0138190 A1 | 5/2016 | Fujibayashi et al. |
| 2017/0271183 A1 | 9/2017 | Brashear et al. |
| 2018/0237943 A1 | 8/2018 | Murphy et al. |
| 2019/0206707 A1 | 7/2019 | Brashear et al. |

* cited by examiner

SEMICONDUCTOR MANUFACTURING DEVICE

CROSS REFERENCE TO RELATED APPLICATIONS

The present application is a continuation application of International Patent Application No. PCT/JP2019/049632 filed on Dec. 18, 2019, which designated the U.S. and claims the benefit of priority from Japanese Patent Application No. 2019-005486 filed on Jan. 16, 2019. The entire disclosures of all of the above applications are incorporated herein by reference.

TECHNICAL FIELD

The present disclosure relates to a semiconductor manufacturing device that forms a thin film or the like by supplying a gas containing a raw material to a substrate such as a semiconductor substrate.

BACKGROUND

In a comparative example, a semiconductor manufacturing device forms a thin film by supplying a gas containing a raw material to a semiconductor substrate. This semiconductor manufacturing device can widely supply the gas to a wafer placed on a susceptor by mixing gases in a collective pipe of a gas supply pipe for each gas type of various gases and distributing the mixed gas to multiple gas introduction pipes.

Each gas supply pipe is provided with a mass flow controller (hereinafter, referred to as a raw material MFC) for raw material inflow, and can adjust the amount of supply of each supply gas to the collective pipe. Further, each gas introduction pipe is also provided with a mass flow controller (hereinafter, distribution MFC) for distribution amount controller, and can adjust the amount of mixed gas introduced to each part of the susceptor.

SUMMARY

A semiconductor manufacturing device may include: a thin film formation portion that may include a chamber; and a supply gas unit that may introduce a supply gas into the chamber. The supply gas unit may include: multiple supply pipes; a raw material flow rate controller that may be installed on each of the multiple supply pipes, and control a flow rate; a collective pipe that may be connected to the multiple supply pipes, and generate a mixed gas; multiple distribution pipes connected to a downstream side of the collective pipe; a pressure controller that may be installed on one distribution pipe, and adjust a mixed gas pressure; and a distribution flow rate controller that may be installed on a distribution pipe different from the distribution pipe provided with the pressure controller, and control a flow rate of the mixed gas.

BRIEF DESCRIPTION OF THE DRAWINGS

The above and other features and advantages of the present disclosure will be more clearly understood from the following detailed description with reference to the accompanying drawings. In the accompanying drawings.

DETAILED DESCRIPTION

Figure 1:
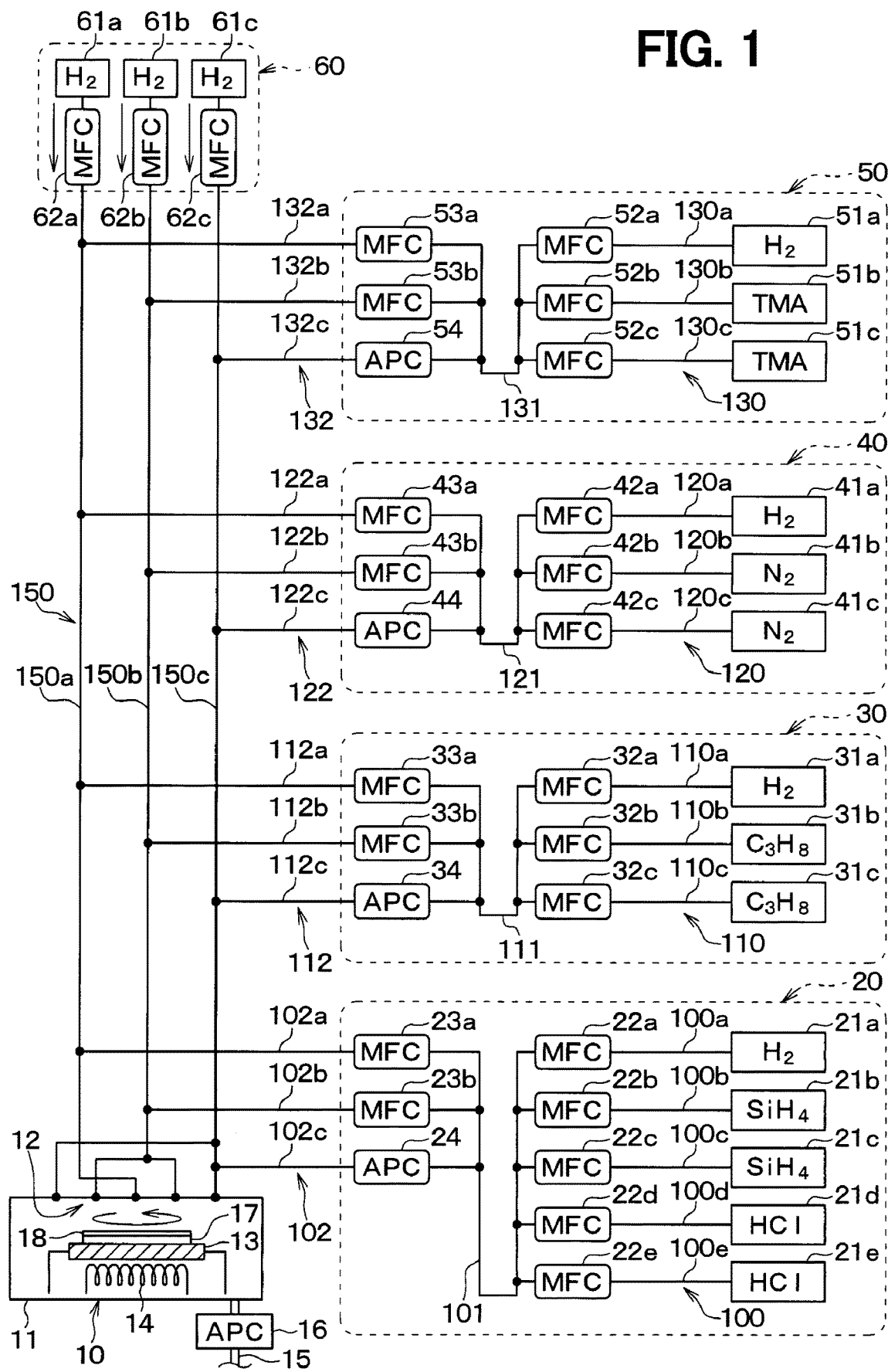
FIG. 1 is a block diagram showing a schematic configuration of a semiconductor manufacturing device according to a first embodiment.

In the comparative example, in the device in which the raw material MFC adjusts the flow rate of a supply gas and the distribution MFC adjusts the flow raw of the mixed gas, there is a control error of the MFC. Therefore, there is a possibility that the flow rate cannot be controlled appropriately. For example, when the total quantity of the mixed gas required to be generated in the collective pipe is 10, the raw material MFC controls a valve opening so that the total quantity (hereinafter, supply gas total quantity) of the supply gas to the collective pipe is 10. Further, the distribution MFC controls the valve opening so that the total quantity (hereinafter, distribution gas total quantity) of the exhaust quantity of the mixed gas from the collective pipe is 10. However, since the control error occurs, for example, the distribution gas total quantity may be 8 when the supply gas total quantity is 10. In this case, although the raw material MFC increases the opening degree of the valve in attempt to keep the flow rate of the supply gas constant, the pressure (hereinafter, referred to as mixed gas pressure) of the mixed gas in the collective pipe increases and a differential pressure between the mixed gas pressure and the pressure (hereinafter, referred to as supply gas pressure) of the supply gas becomes gradually smaller. Then, the flow rate of the mixed gas in the raw material MFC decreases, and it is not possible to supply the mixed gas having the target flow rate. Therefore, it is not possible to appropriately control the flow rate. Such a situation occurs even when the distribution gas total quantity is larger than the supply gas total quantity.

One example of the present disclosure provides a semiconductor manufacturing device capable of forming a thin film by more appropriate flow rate control.

According to one example embodiment, a semiconductor manufacturing device includes a thin film formation portion that includes an installation table on which a substrate is installed, and a chamber that heats the substrate and introduce a supply gas containing a raw material for growing a thin film on the substrate; and a supply gas unit that introduces the supply gas into the chamber. The supply gas unit includes multiple supply pipes that supply multiple gases from a gas introduction source that stores multiple gases containing the raw material; a raw material flow rate controller that is installed in each of the multiple supply pipes, and controls a flow rate of the supply gas through each of the multiple supply pipes; a collective pipe that is connected to the multiple supply pipes on a downstream side with respect to the raw material flow rate controller, and generates a mixed gas of the supply gas; multiple distribution pipes that are connected to a downstream side of the collective pipe, and distribute the mixed gas; a pressure controller that is installed on one of the multiple distribution pipes, and adjusts a mixed gas pressure that is a pressure of the mixed gas; and a distribution flow rate controller that is installed on a distribution pipe different from the distribution pipe provided with the pressure controller among the multiple distribution pipes, and controls a flow rate of the mixed gas through the multiple distribution pipes. In such a configuration, the mixed gas through, at least, a distribution pipe provided with the distribution flow rate controller is introduced into the chamber, and the thin film formation portion grows the thin film.

In such a manner, the mixed gas is distributed by the MFC for the distribution and the pressure controller. Thereby, the semiconductor manufacturing device can supply the target flow rate of the mixed gas through the distribution MFC, and perform the appropriate flow control.

First Embodiment

A first embodiment of the present disclosure will be described below with reference to the drawings. A semiconductor manufacturing device described in the present embodiment is used as a device for forming a thin film by epitaxial growth on multiple substrates.

As shown in FIG. 1, the semiconductor manufacturing device in the present embodiment includes a thin film formation portion 10, a first supply gas unit 20, a second supply gas unit 30, a first dopant gas unit 40, a second dopant gas unit 50, and a carrier gas unit 60. The gas supplied from each unit is introduced into the thin film formation portion 10 through various pipes 100 to 150.

The thin film formation portion 10 includes a chamber 11, a gas introduction portion 12, an installation table 13, a heating device 14, an exhaust port 15, a pressure controller (hereinafter, referred to as APC) 16, and the like. The thin film formation portion 10 can introduce the desired gas into to the chamber 11 through the gas introduction portion 12 while controlling the vacuum degree in the chamber 11 by discharging the atmospheric gas in the chamber 11 through the exhaust port 15. In a case of the present embodiment, the gas introduction portion 12 is placed above the installation table 13 of the chamber 11, and introduces the gas from above the installation table 13.

A substrate 17 is a filmed target, and is placed on the installation table 13 of such a thin film formation portion 10. While the heating device 14 heats the substrate 17 from a back surface side of the substrate 17, the installation table 13 is rotated at high speed. The APC 16 controls the atmospheric pressure in the chamber 11 to be constant, and thereby a thin film 18 is formed. As the substrate 17, various materials can be applied. In the present embodiment, a case where the thin film 18 of SiC is formed on a SiC substrate will be described as an example. In FIG. 1, for simplification, although only one substrate 17 is shown, actually, multiple substrates are mounted on the installation table 13.

The first supply gas unit 20 is a mechanism that introduces the supply gas (hereinafter, Si supply gas) containing a silicon material. Although the Si supply gas may include, at least, a silicon source gas, here, the Si supply gas further includes $H_2$ (hydrogen) as a carrier gas and HCl (hydrogen chloride) as an etching gas.

Specifically, the first supply gas unit 20 includes a distribution APC 24 that is an APC for distribution, in addition to gas introduction sources 21a to 21e, raw material MFCs 22a to 22e, distribution MFCs 23a and 23b. Each portion configuring the first supply gas unit 20 is connected to various pipes 100, 101, and 102. The Si supply gas is supplied to an introduction pipe 150 that is connected to the thin film formation portion 10 and described later.

The gas introduction sources 21a to 21e store material gases containing the raw material for growing the thin film 18, and include a carrier gas introduction source 21a, silicon source gas introduction sources 21b and 21c, and etching gas introduction sources 21d and 21e. The carrier gas introduction source 21a is a portion that stores the carrier gas, and, for example, stores $H_2$ as the carrier gas. The carrier gas introduction source 21a is connected to a supply pipe 100a. The silicon source gas introduction sources 21b and 21c are portions that store the silicon source gas, and, for example, store $SiH_4$ (silane) as the silicon source gas. The silicon source gas introduction sources 21b and 21c are respectively connected to supply pipes 100b and 100c. The etching gas introduction sources 21d and 21e are portions that store the etching gas, and, for example, store HCl as the etching gas. The etching gas introduction sources 21d and 21e are connected to supply pipes 100d and 100e.

Here, although silicon source gas introduction sources 21b and 21c are separately configured, the silicon source gas introduction sources 21b and 21c may be integrated. Further, although etching gas introduction sources 21d and 21e are separately configured, the etching gas introduction sources 21d and 21e may be integrated.

The supply pipes 100a to 100e respectively include the raw material MFCs 22a to 22e, and can adjust the gas flow rate through the supply pipes 100a to 100e, that is, the introduction quantity of each supply gas. The raw material MFC 22b is connected to the silicon source gas introduction source 21b that stores the silicon source gas, and the raw material MFC 22c is connected to the silicon source gas introduction source 21c that stores the silicon source gas. The raw material MFC 22b is used for controlling the large flow rate, and the raw material MFC 22c is used for controlling the small flow rate. Similarly, the raw material MFC 22d is connected to the etching gas introduction source 21d that stores the etching gas, and the raw material MFC 22e is connected to the etching gas introduction source 21e that stores the etching gas. The raw material MFC 22d is used for controlling the large flow rate, and the raw material MFC 22e is used for controlling the small flow rate. Accordingly, it is possible to finely control the flow rate while flowing the silicon source gas or the etching gas at a large flow rate.

Further, each of the supply pipes 100a to 100e is integrated in the collective pipe 101 in the vicinity of the downstream side of the raw material MFCs 22a to 22e, and a mixed gas is generated in the collective pipe 101. As shown in FIG. 1, for example, the above-described vicinity of the downstream side of the raw material MFCs 22a to 22e may correspond to, in a gas flow route from the gas introduction sources 21a to 21e to the chamber 11, a position between the distribution MFCs 23a and 23b and the distribution APC 24, and the raw material MFCs 22a to 22e.

The collective pipe 101 is connected to multiple distribution pipes 102a to 102c on the downstream side again. Therefore, the mixed gas is distributed to each of the distribution pipes 102a to 102c, and introduced into introduction pipe 150 that is connected to the thin film formation portion 10 and is described later.

One of the distribution pipes 102a to 102c, here, the distribution pipe 102c is provided with the distribution APC 24, and the remaining distribution pipes 102 are respectively provided with the distribution MFCs 23a and 23b. The distribution MFCs 23a and 23b can adjust the gas flow rate through the distribution pipes 102a and 102b, that is, the introduction quantity of the mixed gas. The distribution APC 24 adjusts the pressure close to the collective pipe 101, that is, the mixed gas pressure, in other words, adjusts the differential pressure between the mixed gas pressure and the supply gas pressure in the chamber 11 of the thin film formation portion 10. The distribution APC 24 adjusts the mixed gas pressure that is the pressure of the collective pipe 101 to the predetermined pressure by discharging the mixed gas from the side of the collective pipe 101 to the outside. The location where the mixed gas is discharged from the distribution APC 24 is arbitrary. However, in the present embodiment, the distribution pipe 102c is connected to the introduction pipe 150, and the mixed gas discharged for the pressure adjustment by the distribution APC 24 is also supplied to the thin film formation portion 10.

The second supply gas unit 30 is a mechanism that supplies the raw material different from that supplied from the first supply gas unit 20 and introduces the supply gas (hereinafter, referred to as C supply gas) containing a carbon raw material. The C supply gas includes, at least, the carbon source gas, and, here, further includes $H_2$ that is the carrier gas.

Specifically, the second supply gas unit 30 includes a distribution APC 34 that is an APC for distribution, in addition to gas introduction sources 31a to 31c, raw material MFCs 32a to 32c, distribution MFCs 33. Each portion configuring the second supply gas unit 30 is connected to various pipes 110, 111, and 112. The C supply gas is supplied to the introduction pipe 150 that is connected to the thin film formation portion 10 and described later.

The gas introduction sources 31a to 31e store material gases containing the raw material for growing the thin film 18, and include a carrier gas introduction source 31a, carbon source gas introduction sources 31b and 31c. The carrier gas introduction source 31a is a portion that stores the carrier gas, and, for example, stores $H_2$ as the carrier gas. The carrier gas introduction source 31a is connected to a supply pipe 110a. The carbon source gas introduction sources 31b and 31c are portions that store the carbon source gas, and, for example, store $C_3H_8$ (propane) as the carbon source gas. The carbon source gas introduction sources 31b and 31c are respectively connected to supply pipes 110b and 110c.

The supply pipes 110a to 110c respectively include the raw material MFCs 32a to 32c, and can adjust the gas flow rate through the supply pipes 110a to 110c, that is, the introduction quantity of the supply gas. The raw material MFC 32b is connected to the carbon source gas introduction source 31b that stores the carbon source gas, and the raw material MFC 32c is connected to the carbon source gas introduction source 31c that stores the carbon source gas. The raw material MFC 32b is used for controlling the large flow rate, and the raw material MFC 32c is used for controlling the small flow rate. Accordingly, it is possible to finely control the flow while flowing the carbon source gas at a large flow rate.

Further, each of the supply pipes 110a to 110e is integrated in the collecting pipe 111 on the downstream side of the raw material MFCs 32a to 32e, and a mixed gas is generated in the collective pipe 111.

The collective pipe 111 is connected to multiple distribution pipes 112a to 112c on the downstream side again. Therefore, the mixed gas is distributed to each of the distribution pipes 112a to 112c, and introduced into the introduction pipe 150 that is connected to the thin film formation portion 10 and is described later.

One of the distribution pipes 112a to 112c, here, the distribution pipe 112c is provided with the distribution APC 34, and the remaining distribution pipes 112a and 112b are respectively provided with the distribution MFCs 33a and 33b. The distribution MFCs 33a and 33b can adjust the gas flow rate through the distribution pipes 112a and 112b, that is, the introduction quantity of the mixed gas. The distribution APC 34 adjusts the pressure close to the collective pipe 111, that is, the mixed gas pressure, in other words, adjusts the differential pressure between the mixed gas pressure and the supply gas pressure in the chamber 11 of the thin film formation portion 10. The distribution APC 34 adjusts the mixed gas pressure, which is the pressure of the collective pipe 111, to the predetermined pressure by discharging the mixed gas from a side close to the collective pipe 111 to the outside. The location where the mixed gas is discharged from the distribution APC 34 is arbitrary. However, in the present embodiment, the distribution pipe 112c is connected to the introduction pipe 150, and also the mixed gas discharged for adjusting the pressure at the distribution APC 34 is supplied to the thin film formation portion 10.

The first dopant gas unit 40 is a mechanism for introducing a first dopant raw material, for example, a supply gas (hereinafter, first dopant gas) containing an n type dopant. The first dopant gas contains, at least, the first dopant raw material, and, here, further contains $H_2$ that is the carrier gas.

Specifically, the first dopant gas unit 40 includes a distribution APC 44 that is an APC for distribution, in addition to gas introduction sources 41a to 41c, raw material MFCs 42a to 42c, distribution MFCs 43a and 43b. Each portion configuring the first dopant gas unit 40 is connected to various pipes 120, 121, and 122. The first dopant gas is supplied to the introduction pipe 150 that is connected to the thin film formation portion 10 and described later.

The gas introduction sources 41a to 41c include a carrier gas introduction source 41a and first dopant gas introduction sources 41b and 41c. The carrier gas introduction source 41a is a portion that stores the carrier gas, and, for example, stores $H_2$ as the carrier gas. The carrier gas introduction source 41a is connected to a supply pipe 120a. The first dopant gas introduction sources 41b and 41c are portions the store the first dopant raw material, and, for example, store $N_2$ (nitrogen) containing N (nitrogen element) that is the n type dopant. The first dopant gas introduction sources 41b and 41c are respectively connected to supply pipes 120b and 120c.

The supply pipes 120a to 120c respectively include raw material MFCs 42a to 42c. The gas flow rate through each of the supply pipes 120a to 120c, that is, the introduction quantity of each supply gas can be adjusted. The raw material MFC 42b is connected to the first dopant gas introduction source 41b that stores the first dopant raw material, and the raw material MFC 42c is connected to the first dopant gas introduction source 41c that stores the first dopant raw material. The raw material MFC 42b is used for controlling the large flow rate, and the raw material MFC 42c is used for controlling the small flow rate. Accordingly, it may be possible to finely control the flow rate while flowing the first dopant raw material gas having the large quantity.

Further, each of the supply pipes 120a to 120c is integrated in the collective pipe 121 on the downstream side with respect to the raw material MFCs 42a to 42c. In the collective pipe 121, the mixed gas is generated.

The collective pipe 121 is connected to multiple distribution pipes 122a to 122c on the downstream side again. Therefore, the mixed gas is distributed to each of the distribution pipes 122a to 122c, and introduced into the introduction pipe 150 that is connected to the thin film formation portion 10 and is described later.

One of the distribution pipes 122a to 122c, here, the distribution pipe 122c is provided with the distribution APC 44, and the remaining distribution pipes 122a and 122b are respectively provided with the distribution MFCs 43a and 43b. The distribution MFCs 43a and 43b can adjust the gas flow rate through the distribution pipes 122a and 122b, that is, the introduction quantity of the mixed gas. The distribution APC 44 adjusts the pressure close to the collective pipe 121, in other words, adjusts the differential pressure between the mixed gas pressure and the supply gas pressure in the chamber 11 of the thin film formation portion 10. The distribution APC 44 adjusts the mixed gas pressure, which is the pressure of the collective pipe 121, to the predetermined pressure by discharging the mixed gas from a position close to the collective pipe 121 to the outside. The location where the mixed gas is discharged from the distribution APC 44 is arbitrary. However, in the present embodiment, the distribution pipe 122c is connected to the introduction pipe 150, and also the mixed gas discharged for adjusting the pressure at the distribution APC 44 is supplied to the thin film formation portion 10.

The second dopant gas unit 50 is a mechanism for introducing a second dopant raw material, for example, a supply gas (hereinafter, second dopant gas) containing a p type dopant. The second dopant gas includes, at least, the second dopant raw material, and, here, further includes $H_2$ that is the carrier gas.

Specifically, the second dopant gas unit 50 includes a distribution APC 54 that is an APC for distribution, in addition to gas introduction sources 51a to 51c, raw material MFCs 52a to 52c, distribution MFCs 53a and 53b. Each portion configuring the second dopant gas unit 50 is connected to various pipes 130, 131, and 132. The second dopant gas is supplied to the introduction pipe 150 that is connected to the thin film formation portion 10 and described later.

The gas introduction sources 51a to 51c include a carrier gas introduction source 51a and second dopant gas introduction sources 51b and 51c. The carrier gas introduction source 51a is a portion that stores the carrier gas, and, for example, stores $H_2$ as the carrier gas. The carrier gas introduction source 51a is connected to a supply pipe 130a. The second dopant gas introduction sources 51b and 51c are portions the store the second dopant raw material, and, for example, store Al (aluminum) containing TMA (trimethylaluminum) that is the P type dopant. The second dopant gas introduction sources 51b and 51c are respectively connected to supply pipes 130b and 130c.

The supply pipes 130a to 130c respectively include raw material MFCs 52a to 52c. The gas flow rate through each of the supply pipes 130a to 130c, that is, the introduction quantity of each supply gas can be adjusted. The raw material MFC 52b is connected to the second dopant gas introduction source 51b that stores the first dopant raw material, and the raw material MFC 52c is connected to the second dopant gas introduction source 51c that stores the second dopant raw material. The raw material MFC 52b is used for controlling the large flow rate, and the raw material MFC 52c is used for controlling the small flow rate. Accordingly, it may be possible to finely control the flow rate while flowing the second dopant raw material gas having the large quantity.

Further, each of the supply pipes 130a to 130c is integrated in the collective pipe 131 on the downstream side with respect to the raw material MFCs 52a to 52c. The mixed gas is generated in the collective pipe 131.

The collective pipe 131 is connected to multiple distribution pipes 132a to 132c on the downstream side again. Therefore, the mixed gas is distributed to each of the distribution pipes 132a to 132c, and introduced into the introduction pipe 150 that is connected to the thin film formation portion 10 and is described later.

One of the distribution pipes 132a to 132c, here, the distribution pipe 132c is provided with the distribution APC 54, and the remaining distribution pipes 132a and 132b are respectively provided with the distribution MFCs 53a and 53b. The distribution MFCs 53a and 53b can adjust the gas flow rate through the distribution pipes 132a and 132b, that is, the introduction quantity of the mixed gas. The distribution APC 54 adjusts the pressure at a position close to the collective pipe 131, in other words, adjusts the differential pressure between the mixed gas pressure and the supply gas pressure in the chamber 11 of the thin film formation portion 10. The distribution APC 54 adjusts the mixed gas pressure, which is the pressure of the collective pipe 131, to the predetermined pressure by discharging the mixed gas from a position close to the collective pipe 131 to the outside. The location where the mixed gas is discharged from the distribution APC 54 is arbitrary. However, in the present embodiment, the distribution pipe 132c is connected to the introduction pipe 150, and also the mixed gas discharged for adjusting the pressure at the distribution APC 54 is supplied to the thin film formation portion 10.

The carrier gas unit 60 is a mechanism for introducing the carrier gas. Among the supply gases introduced to the thin film formation portion 10, the carrier gas has the most introduced amount. Therefore, the carrier gas unit 60 is connected to the introduction pipe 150 directly connected to the thin film formation portion 10, and the carrier gas introduced from the carrier gas unit 60 forms the main flow of the supply gas. Thereby, it may be possible to stably form the main flow of the carrier gas, so that it may be possible to form a state in which another material gas or the like is introduced.

Specifically, the carrier gas unit 60 includes carrier gas introduction sources 61a to 61c and MFCs (hereinafter, carrier gas MFCs) 62a to 62c for carrier gas, and forms the main flow of the supply gas by the carrier gas.

The carrier gas introduction sources 61a to 61c are portions that store the carrier gas, and, for example, store $H_2$ as the carrier gas. The carrier gas introduction sources 61a to 61c are respectively connected to the introduction pipes 150a to 150c. The introduction pipes 150a to 150c respectively include carrier gas MFCs 62a to 62c, and can adjust the gas flow rate of the carrier gas to the introduction pipe 150a to 150c. The introduction pipes 150a to 150c are respectively connected to distribution pipes 102a to 102c, 112a to 112c, 122a to 122c, 132a to 132c of units 20 to 50. Therefore, various supply gases are introduced from the first supply gas unit 20, the second supply gas unit 30, the first dopant gas unit 40, and the second dopant gas unit 50 to the introduction pipes 150a to 150c, and various gases and carrier gas are introduced to the chamber 11. More specifically, the introduction pipe 150a introduces the gas to the center of installation table 13, the introduction pipe 150c introduces the gas to the outer circumference of the installation table 13, and the introduction pipe 150b introduces the gas to the portion between the center and the outer circumference.

Since such a configuration is provided, by controlling the carrier gas flow rate in accordance with the increase and decrease in the flow rate of various supply gases, the carrier gas unit 60 can widely change the distribution rate of various supply gases without disturbing the gas flow in the chamber 11. Accordingly, it may be possible to form the thin film 18 formed on the substrate 17 by controlling the in-plane uniformity under wide film formation conditions.

In the above, the carrier gas introduction sources 21*a*, 31*a*, 41*a*, 51*a*, and 61*a* to 61*c* in which the carrier gas is stored, are separately provided. However, the carrier gas introduction sources 21*a*, 31*a*, 41*a*, 51*a*, and 61*a* to 61*c* may be provided as one carrier gas introduction source, or some of the carrier gas introduction sources may be shared.

Figure 2:
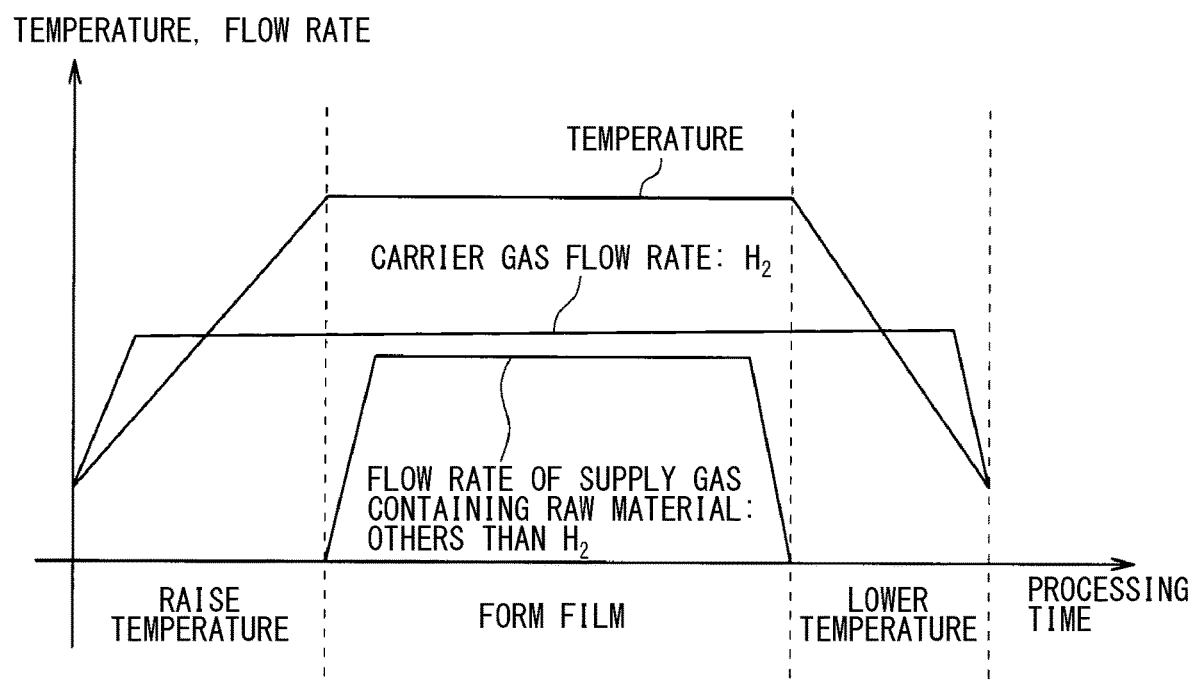
FIG. 2 is a diagram showing a thin film manufacturing profile by the semiconductor manufacturing device shown in FIG. 1.

Next, a thin film formation method for the semiconductor manufacturing device having such a configuration in the present embodiment will be described with reference to a profile of a thin film formation process as shown in FIG. 2.

With regard to the semiconductor manufacturing device according to the present embodiment, first, multiple substrates 17, on which the film is to be formed, are prepared and installed on the thin film formation portion 10, that is, on the installation table 13 in the chamber 11. Then, while the installation table 13 is rotated at high speed, the thin film is formed by the process in accordance with the profile shown in FIG. 2.

Specifically, a temperature raising process for raising the temperature in the chamber 11 and the temperature of the substrate 17 are executed by heating with the heating device 14. At the same time, the carrier gas is introduced from the carrier gas introduction sources 61*a* to 61*c* based on the gas flow rate control by each of the carrier gas MFCs 62*a* to 62*c* of the carrier gas unit 60. Further, the carrier gas is introduced from the first supply gas unit 20, the second supply gas unit 30, the first dopant gas unit 40, and the second dopant gas unit 50. Further, the APC 16 adjusts the discharged quantity of the atmospheric gas from the chamber 11 while keeping the pressure in the chamber 11 constant.

When the temperature in the chamber 11 and the substrate 17 reach the predetermined temperature, the supply of various supply gases from the first supply gas unit 20, the second supply gas unit 30, the first dopant gas unit 40, and the second dopant gas unit 50 start. Thereby, the Si supply gas, the C supply gas, the first dopant raw material, and the second dopant raw material are introduced into the chamber 11. Then, since the carrier gases are continuously introduced from the carrier gas unit 60, the first supply gas unit 20, the second supply gas unit 30, the first dopant gas unit 40, and the second dopant gas unit 50, the gases are introduced into the chamber 11 so that various supply gases are added to the carrier gases that serve as the main flow. Therefore, various supply gases can be carried to the chamber 11 by the carrier gas which is stable as the main flow.

Then, the introduction of various supply gases is continued while a constant temperature is maintained by adjusting the heating amount by the heating device 14. Thereby, the thin film 18 of the SiC is epitaxially grown on the substrate 17. Since the installation table 13 is rotated at high speed, the gas flow in the chamber 11 is stabilized, and it may be possible to improve the in-plane uniformity of the film thickness of the thin film 18 of the SiC and the concentration by the gas distribution.

After the thin film 18 of the SiC is formed in the predetermined film thickness, a temperature lowering process of stopping the introduction of various supply gases and stopping heating by the heating device 14 to reduce the temperature of the substrate 17 in the chamber 11 is executed. At this time as well, the introduction of the carrier gas from the carrier gas unit 60 continues, and the influence of the residual supply gas is reduced. When the temperature in the chamber 11 and the temperature of the substrate 17 drop to, for example, room temperature, the thin film formation process ends.

In such a thin film formation method, for example, the distribution APC 24 of the first supply gas unit 20 adjusts the mixed gas pressure in the collective pipe 101. That is, when the mixed gas in the collective pipe 101 is supplied to each of the introduction pipes 150*a* to 150*c* through the distribution pipes 102*a* to 102*c*, the distribution MFCs 23*a* and 23*b* distribute the gas and the distribution APC 24 adjusts the mixed gas pressure. Therefore, the mixed gas pressure on the upstream side of the distribution MFCs 23*a* and 23*b* are adjusted to the desired pressure. Accordingly, the distribution gas total quantity, which is the total quantity of the mixed gas discharged from the collective pipe 101 through the distribution pipes 102*a* to 102*c*, is matched with the supply gas total quantity, which is the total quantity of the supply gas supplied from the gas introduction sources 21*a* to 21*e* through the raw material MFCs 22*a* to 22*e*. Therefore, it may be possible to more appropriately control the flow rate so that the flow rate of the mixed gas introduced from the distribution pipes 102*a* to 102*c* into the introduction pipes 150*a* to 150*c* reaches the target flow rate. This will be described with reference to FIGS. 3 and 4.

Figure 3:
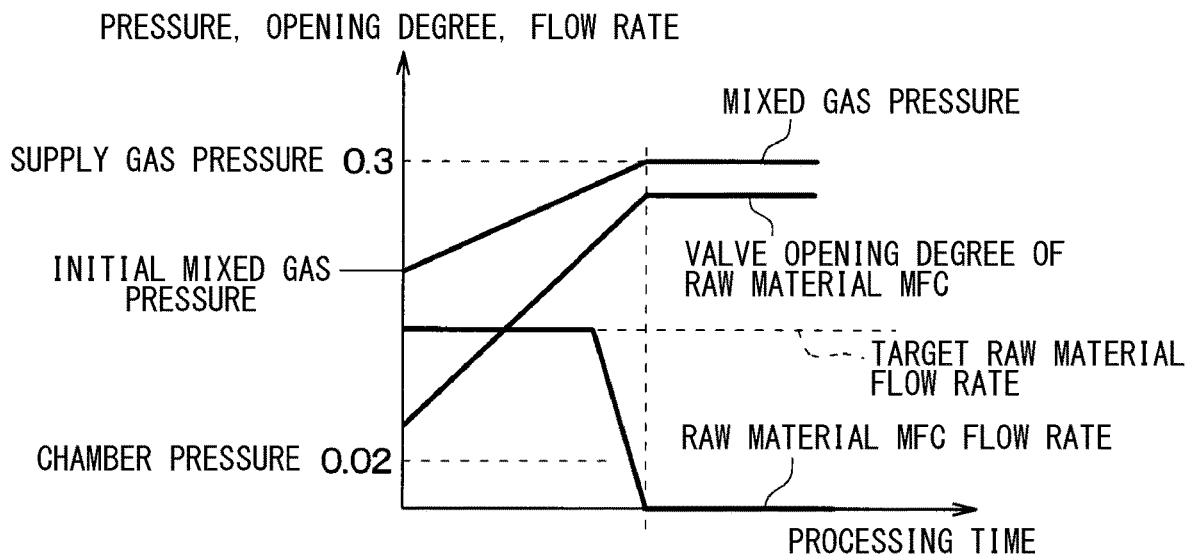
FIG. 3 is a timing chart showing a state of each part when a raw material MFC performs a flow rate control.

First, based on FIG. 3, hypothetically, a case where the distribution APC 24 is the distribution MFC, that is, a case where the MFCs control the distribution flow rate of the collected gas by the distribution pipes 102*a* to 102*c* will be examined.

In this case, while the raw material MFCs 22*a* to 22*e* adjust the flow rate of the supply gas, the distribution MFCs provided at the positions of the distribution MFCs 23*a* and 23*b* and the distribution APC 24 adjust the flow rate of the mixed gas. In such a configuration, since there is a control error of the MFC, the flow rate cannot be appropriately controlled. For example, it is assumed that the supply gas pressure in each of the gas introduction sources 21*a* to 21*e* is 0.3 [MPa] and a chamber pressure, which is the supply gas pressure in the chamber 11, is 0.02 [MPa].

In this case, when the total quantity of the mixed gas required to be generated in the collective pipe 101 is 10, the raw material MFCs 22*a* to 22*e* control the valve opening so that the total quantity of the supply gas to the collective pipe 101 is 10. The distribution MFCs, which is provided at the positions of the distribution MFCs 23*a* and 23*b* and the distribution APC 24, controls the opening degree of the valve so that the total quantity of the distribution gases discharged from the collective pipe 101 is 10. However, since the control error occurs, for example, the distribution gas total quantity may be 8 when the supply gas total quantity is 10. In this case, although the distribution MFCs, which are provided at the positions of the distribution MFCs 23*a* and 23*b* and the distribution APC 24, increase the valve opening degree for keeping the flow rate of the mixed gas constant, the mixed gas pressure in the collective pipe 101 increases with respect to the initial value. As the result, the differential pressure between the mixed gas pressure and the supply gas pressure becomes gradually small. Then, the flow rate of the mixed gas in the raw material MFC 22*a* to 22*e* decreases, and it is not possible to supply the mixed gas having the target flow rate. Therefore, the flow rate cannot be appropriately controlled.

Figure 4:
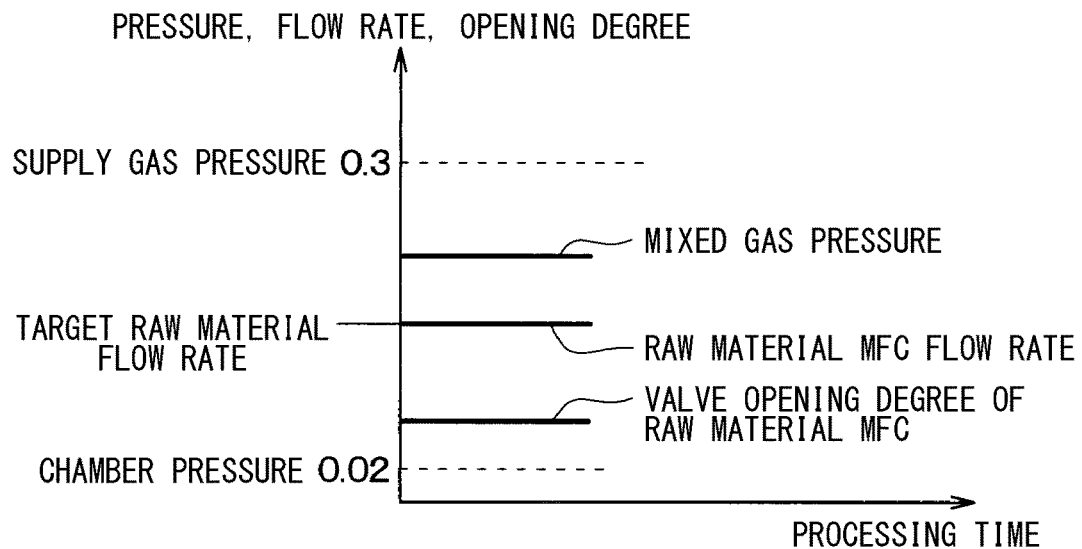
FIG. 4 is a timing chart showing a state of each part when the semiconductor manufacturing device according to first embodiment performs the flow rate control.

Next, a case where the distribution APC 24 is provided as in the present embodiment will be described with reference to FIG. 4.

In this case, while the raw material MFCs 22*a* to 22*e* adjust the flow rate of the supply gas, the distribution MFCs 23*a* and 23*b* and the distribution APC 24 adjust the flow rate of the mixed gas. In such a configuration, although there is the control error of the MFC, the flow rate can be appropriately controlled.

For example, it is assumed that the supply gas pressure in each of the gas introduction sources 21*a* to 21*e* is 0.3 [MPa] and a chamber pressure, which is the pressure in the chamber 11, is 0.02 [MPa].

In this case, when the total quantity of the mixed gas required to be generated in the collective pipe 101 is 10, the raw material MFCs 22*a* to 22*e* control the valve opening so that the total quantity of the supply gas to the collective pipe 101 is 10. The distribution MFCs 23*a* and 23*b* and the distribution APC 24 control the opening degree of the valve so that the total quantity of the distribution gases discharged from the collective pipe 101 is 10.

Then, although the control errors of the distribution MFCs 23*a* and 23*b* occur, the distribution APC 24 adjusts the mixed gas pressure to the predetermined pressure. Therefore, the differential pressure between the chamber pressure, which is the supply gas pressure in the chamber 11, and the mixed gas pressure is kept constant. Accordingly, the supply gas total quantity and the distribution gas total are substantially same, and it may be possible to adjust the flow rate of the mixed gas through the distribution MFCs 23*a* and 23*b* to the target flow rate. As a result, it may be possible to appropriately control the flow rate.

As described above, in the present embodiment, not only the distribution MFCs 23*a* and 23*b* but also the distribution APC 24 may distribute the mixed gas. Thereby, it may be possible to adjust the flow rate of the mixed gas through the distribution MFCs 23*a* and 23*b*, and provide the semiconductor manufacturing device capable of appropriately controlling the flow rate. According to such a semiconductor manufacturing device, it may be possible to improve the in-plane uniformity of the film quality and the depth direction uniformity of the thin film 18 formed on the substrate 17.

In addition, in the case of the present embodiment, the mixed gas discharged from the distribution APC 24 is not discarded to the outside, and is supplied to the introduction pipe 150*c* and supplied to into the chamber 11. Thereby, it may be possible to provide a highly economical semiconductor manufacturing device. In this case, the flow rate of the mixed gas supplied to the introduction pipe 150*c* through the distribution APC 24 may be set to a value obtained by subtracting the total quantity of the mixed gas flowing through the distribution MFCs 23*a* and 23*b* from the supply gas total quantity.

Further, since the distribution MFCs 23*a* and 23*a* control the flow rate and the distribution APC 24 controls the pressure, there is a possibility that the flow rate of the mixed gas through the distribution APC 24 is not equal to the flow rate of the mixed gas through the distribution MFCs 23*a* and 23*b*. However, inherently, there is a possibility that the flow rate of the mixed gas through the distribution MFCs 23*a* and 23*b* are set to a different value depending on the position of the substrate 17 to which the mixed gas is supplied, and is not necessarily equal. Therefore, the flow rate of the mixed gas through the distribution APC 24 does not have to be equal to the flow rate of the mixed gas through the distribution MFCs 23*a* and 23*b*. Of course, it is preferable to adjust the flow rate of the mixed gas through the distribution MFCs 23*a* and 23*b* so that the difference between these flow rates becomes small.

Further, as shown in FIG. 1, the supply gas, which is discharged by the distribution APC 24, is supplied to a position closer to the outer circumference of the chamber 11 as compared with the supply gas from the distribution MFCs 23*a* and 23*b*, that is, a position corresponding to the outer peripheral position of the installation table 13. At the position close to the outer circumference of the chamber 11, a gas flow speed becomes due to influence substrate 17 as a wall surface of the chamber 11, and a gas supply speed to the substrate 17 becomes slow. Therefore, the supply gas, which is discharged by the distribution APC 24, is introduced to the position close to the outer circumference in the chamber 11. At an inner position as compared with the position described above, the distribution MFCs 23*a* and 23*b* high accurately control the flow rate and finely adjust the introduction quantity of the supply gas, so that the in-plane uniformity of the introduction quantity of the supply gas is improved. Thereby, it may be possible to improve the in-plane uniformity of the thin film 18 formed on the substrate 17.

Here, the first supply gas unit 20 is described as an example. However, also in cases of the second supply gas unit 30, the first dopant gas unit 40, and the second dopant gas unit 50, the similar effect can be obtained by using the distribution APCs 34, 44, and 54. These may not be separately provided as units, all of them may be provided as one unit, and one collective pipe can generate the mixed gas. However, it may be possible to independently control the flow rate for each material raw gas or dopant element by providing separate units. Thereby, it may be possible to improve the in-plane uniformity of the thin film 18 formed on the substrate 17.

Further, the first supply gas unit 20, the second supply gas unit 30, the first dopant gas unit 40, and the second dopant gas unit 50 include the carrier gas as the supply gas. Then, the flow rate of the carrier gas of the first supply gas unit 20 is set to be equal to or more than the sum of the minimum control flow rates of the distribution MFCs 23*a* and 23*b* and the distribution APC 24. The flow rate of the carrier gas of the second supply gas unit 30 is set to be equal to or more than the sum of the minimum control flow rates of the distribution MFCs 33*a* and 33*b* and the distribution APC 34. The flow rate of the carrier gas of the first dopant gas unit 40 is set to be equal to or more than the sum of the minimum control flow rates of the distribution MFCs 43*a* and 43*b* and the distribution APC 44. Further, the flow rate of the carrier gas of the second dopant gas unit 50 is set to be equal to or more than the sum of the minimum control flow rates of the distribution MFCs 53*a* and 53*b* and the distribution APC 54. In this way, the gas can be flowed from each unit even when the Si raw material gas, the C raw material gas, or the dopant gas is not flown. In this case, by adjusting the flow rate of the carrier gas introduced from the carrier gas unit 60 and the flow rate of the carrier gas introduced as the supply gas from each unit to the predetermined rate, the flow is stabilized from a time when the Si raw material gas, the C raw material gas, or the dopant gas begins to flow. Thereby, it may be possible to improve the in-plane uniformity of the film quality of the thin film 18 formed on the substrate 17 and the depth direction uniformity.

Second Embodiment

A second embodiment of the present disclosure will be described. The present embodiment is obtained by changing the gas distribution portion of the first embodiment, and the other portions are similar to that of the first embodiment. Therefore, only the difference will be described.

Figure 5:
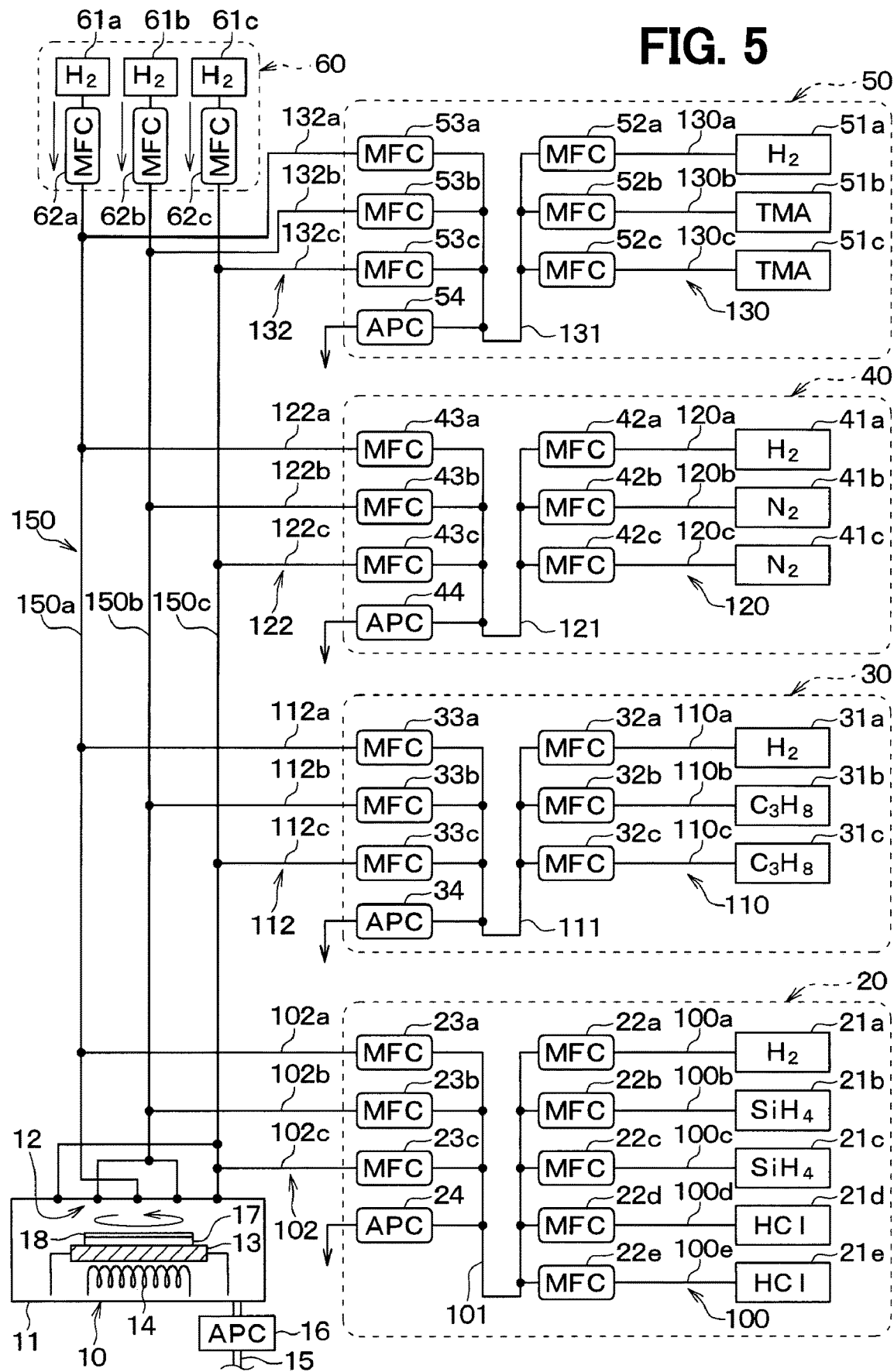
FIG. 5 is a block diagram showing a schematic configuration of a semiconductor manufacturing device according to a second embodiment.

As shown in FIG. 5, in the present embodiment, the supply gases discharged by the distribution APC 24 of the unit 20, the distribution APC 34 of the unit 30, the distribution APC 44 of the unit 40, and the distribution APC 54 of the unit 50 are not introduced to the position close to the chamber 11, and are discharged to the outside. Instead, another distribution MFC 23c, 33c, 43c, and 53c are added to units 20 to 50.

As described above, for the distribution APCs 24, 34, 44, and 54, it is possible to only adjust the mixed gas pressure in the units 20 to 50. In this way, it may be possible to introduce the mixed gas into the chamber 11 based on the accurate flow rate control by the distribution MFCs 23a to 23c, 33a to 33c, 43a to 43c, and 53a to 53c. Accordingly, it may be possible to improve the in-plane uniformity of the film quality of the thin film 18 formed on the substrate 17 and the depth direction uniformity.

Other Embodiments

The present disclosure is not limited to the above-described embodiments and may be appropriately modified with the scope described in the claims. The embodiments described above are not independent of each other, and can be appropriately combined except when the combination is obviously impossible. Individual elements or features of a particular embodiment are not necessarily essential unless it is specifically stated that the elements or the features are essential in the foregoing description, or unless the elements or the features are obviously essential in principle. Further, in each of the embodiments described above, when numerical values such as the number, numerical value, quantity, range, and the like of the constituent elements of the embodiment are referred to, except in the case where the numerical values are expressly indispensable in particular, the case where the numerical values are obviously limited to a specific number in principle, and the like, the present disclosure is not limited to the specific number. Further, in each of the embodiments described above, when referring to the shape, positional relationship, and the like of the components and the like, it is not limited to the shape, positional relationship, and the like, except for the case where the components are specifically specified, the case where the components are fundamentally limited to a specific shape, positional relationship, and the like.

For example, in the first embodiment, the mode in which the supply gases discharged by the distribution APCs 24, 34, 44, and 54 are introduced in the chamber 11 is described. In the second embodiment, the mode in which supply gases are discarded to the outside of the chamber 11 is described. However, it is unnecessary to employ a mode in which the supply gases discharged by all of the distribution APCs 24, 34, 44, and 54 are introduced into the chamber 11 or discarded to the outside of the chamber 11. A mode in which only a part of gases is introduced into the chamber 11 and the remaining part is discarded to the outside may be employed. Although, in the above, the Si raw material gas and the C raw material gas are introduced from the separate units, the materials may be introduced from the same unit.

In the embodiments described above, the first dopant gas unit 40 and the second dopant gas unit 50 are provided. However, when the dopant is not introduced, these are unnecessary, and only one of them may be provided. Further, in the embodiments described above, since the case of forming the thin film 18 of the SiC is described, the Si supply gas is described as the example of the first source gas, and the C supply gas is described as the example of the second source gas. However, this differs depending on the material to be formed into a film. For example, in a case of a material for forming a silicon thin film, only the supply gas unit for supplying the Si supply gas may be provided. Although the Si supply gas or the C supply gas are respectively supplied through two raw material MFCs 22b, 22c, 32b, and 32c, the Si supply gas or the C supply gas may be supplied through at least one raw material MFC.

Figure 6:
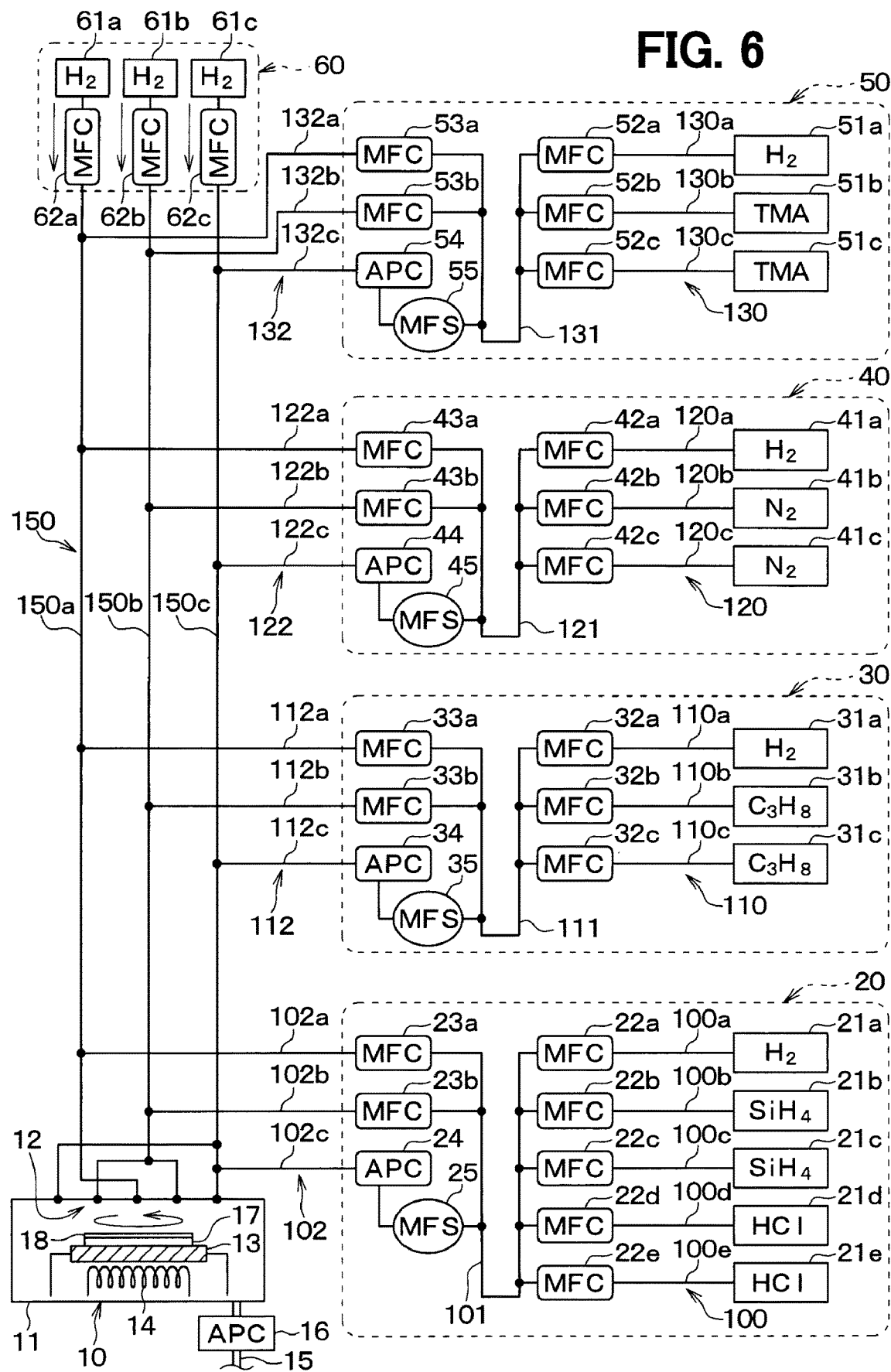
FIG. 6 is a diagram showing a schematic configuration of a semiconductor manufacturing device according to a third embodiment.

As shown in FIG. 6, mass flow sensors (MFSs) 25, 35, 45, and 55 may be provided on the upstream side or the downstream side of the distribution APCs 24, 34, 44, and 54. In this way, it may be possible to measure the flow rates of the supply gases discharged by the distribution APCs 24, 34, 44, and 54, and, based on this, it may be possible to control the flow rates of, for example, other raw materials MFC 22a and 22b and the like. In the above, the embodiments, the configurations, the aspects of the semiconductor manufacturing device according to the present disclosure are exemplified.

The present disclosure is not limited to the above-described embodiments, each configuration and each aspect related to the present disclosure. For example, embodiments, configurations, and examples obtained from an appropriate combination of technical elements disclosed in different embodiments, configurations, and examples are also included within the scope of the embodiments, configurations, and examples of the present disclosure.

The reference numeral 10 indicates a thin film formation portion. The reference numeral 20 indicates a first supply gas unit. The reference numeral 30 indicates a second supply gas unit. The reference numeral 40 indicates a first dopant gas unit. The reference numeral 50 indicates a second dopant gas unit. The reference numeral 60 indicates a carrier gas unit. The reference numerals 100 to 150 indicate various pipes. The reference numerals 22a to 22e, 32a to 32b, 42a to 42c, and 52a to 52c indicate gas introduction sources. The reference numerals 23a, 23b, 33a, 33b, 43a, 43b, 53a, and 53b indicate distribution MFCs. The reference numerals 24, 34, 44, and 54 indicate distribution APCs.

The invention claimed is:

1. A semiconductor manufacturing device comprising:
   a thin film formation portion that includes
   an installation table on which a substrate is installed, and
   a single chamber configured to heat the substrate and introduce a supply gas containing a raw material for growing a thin film on the substrate; and
   a supply gas unit configured to introduce the supply gas into the single chamber via an introduction pipe, wherein:
   the supply gas unit includes a plurality of supply gas units provided for each type of the raw material for growing the thin film;
   each supply gas unit includes:
   a plurality of supply pipes configured to supply a plurality of gases from a gas introduction source configured to store a plurality of gases containing the raw material;
   each raw material flow rate controller that
   is installed on each of the plurality of supply pipes, and
   is configured to control a flow rate of the supply gas through each of the plurality of supply pipes;
   a collective pipe that
   is connected to the plurality of supply pipes on a downstream side with respect to the raw material flow rate controller, and is configured to generate a mixed gas of the supply gas;
a plurality of distribution pipes that
are connected to a downstream side of the collective pipe, and
are configured to distribute the mixed gas;
a pressure controller that
is installed on one of the plurality of distribution pipes, and
is configured to adjust a mixed gas pressure that is a pressure of the mixed gas; and
a distribution flow rate controller that
is installed on a distribution pipe different from the distribution pipe provided with the pressure controller among the plurality of distribution pipes, and
is configured to control a flow rate of the mixed gas through the plurality of distribution pipes;
some of the plurality of supply pipes supply a carrier gas that becomes a part of the supply gas to the collective pipe;
the raw material flow rate controller includes:
a first flow rate controller for controlling a large flow rate for a supply of the raw material via one of the plurality of supply pipes with the raw material flow rate controller;
a second flow rate controller for controlling a small flow rate for the supply of the raw material via another supply pipe; and
a third flow rate controller for controlling a flow rate of the carrier gas supplied via the one supply pipe and the another supply pipe;
the plurality of distribution pipes are connected to the introduction pipe on a downstream side with respect to the pressure controller and the distribution flow rate controller; and
the mixed gas through, at least, a distribution pipe provided with the distribution flow rate controller is introduced into a single processing area of the single chamber, the distribution pipe with the pressure controller, and the introduction pipe, and the thin film formation portion grows the thin film.

2. The semiconductor manufacturing device according to claim 1, wherein:
the distribution pipe with the pressure controller is placed at a position corresponding to an outer circumference of the single chamber such that a first portion of the mixed gas introduced through the distribution pipe provided with the pressure controller into a vicinity of an outer circumference of the installation table is greater than a second portion of the mixed gas introduced through the distribution pipe provided with the distribution flow rate controller.

3. The semiconductor manufacturing device according to claim 1, further comprising:
a carrier gas unit configured to introduce a carrier gas into the single chamber, in addition to the supply gas unit, wherein:
the introduction pipe includes a plurality of introduction pipes;
the carrier gas unit is connected to the plurality of introduction pipes configured to introduce the carrier gas into the single chamber; and
among the plurality of distribution pipes, at least the distribution pipe provided with the distribution flow rate controller and the distribution pipe with the pressure controller are connected to each of the plurality of introduction pipes, and the mixed gas is introduced through the plurality of introduction pipes.

4. The semiconductor manufacturing device according to claim 1, wherein:
the supply gas unit is configured to introduce also a carrier gas from a part of the plurality of supply pipes, in addition to the raw material as the supply gas.

5. The semiconductor manufacturing device according to claim 1, wherein
each of the plurality of supply gas units is configured to supply the supply gas containing a raw material different for each of the plurality of supply gas unit.

6. The semiconductor manufacturing device according to claim 1, further comprising:
a dopant unit configured to supply, as the supply gas, a dopant raw material gas containing a raw material to be a dopant of the thin film, in addition to the supply gas unit.

7. The semiconductor manufacturing device according to claim 1, wherein:
the thin film formation portion forms a silicon carbide thin film as the thin film on a silicon carbide substrate that is the substrate;
the plurality of supply gas units include a first supply gas unit configured to introduce a silicon supply gas including a silicon raw material and a second supply gas unit configured to introduce a carbon supply gas including a carbon raw material;
the first supply gas unit
includes, as a part of the plurality of supply pipes,
a supply pipe configured to introduce a silicon source gas from a silicon source gas introduction source that is a part of the gas introduction source and
a supply pipe configured to introduce an etching gas of a silicon from an etching gas introduction source that is the part of the gas introduction source and
includes ,as the raw material flow rate controller, an etching gas flow rate controller; and
the etching gas flow rate controller includes
a flow rate controller for controlling a large flow rate for an etching gas supply and
a flow rate controller for controlling a small flow rate for the etching gas supply.

* * * * *